(12) United States Patent
Lo et al.

(10) Patent No.: US 10,026,722 B1
(45) Date of Patent: Jul. 17, 2018

(54) LIGHT EMITTING COMPONENT AND DISPLAY DEVICE

(71) Applicant: PlayNitride Inc., Tainan (TW)

(72) Inventors: Yu-Yun Lo, Tainan (TW); Yu-Hung Lai, Tainan (TW); Tzu-Yang Lin, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 15/583,437

(22) Filed: May 1, 2017

(30) Foreign Application Priority Data

Mar. 10, 2017 (TW) .............................. 106108082 A

(51) Int. Cl.
| | |
|---|---|
| *H01L 29/18* | (2006.01) |
| *H01L 33/00* | (2010.01) |
| *H01L 25/16* | (2006.01) |
| *H01L 27/12* | (2006.01) |
| *H01L 33/40* | (2010.01) |
| *H01L 33/28* | (2010.01) |
| *H01L 33/32* | (2010.01) |
| *H01L 25/075* | (2006.01) |
| *H01L 33/38* | (2010.01) |
| *H01L 33/22* | (2010.01) |
| *H01L 33/24* | (2010.01) |
| *H01L 33/62* | (2010.01) |

(52) U.S. Cl.
CPC ........ *H01L 25/167* (2013.01); *H01L 25/0753* (2013.01); *H01L 27/1214* (2013.01); *H01L 33/22* (2013.01); *H01L 33/24* (2013.01); *H01L 33/28* (2013.01); *H01L 33/32* (2013.01); *H01L 33/385* (2013.01); *H01L 33/405* (2013.01); *H01L 33/62* (2013.01)

(58) Field of Classification Search
CPC ....... H01L 25/167; H01L 33/62; H01L 33/24; H01L 33/22; H01L 33/385; H01L 33/32; H01L 33/28; H01L 33/405; H01L 27/1214; H01L 25/0753
See application file for complete search history.

(56) References Cited

U.S. PATENT DOCUMENTS

| | | | |
|---|---|---|---|
| 2015/0287762 A1* | 10/2015 | Chae | ........................ H01L 33/38 362/97.1 |
| 2016/0064611 A1* | 3/2016 | Choi | ...................... H01L 33/382 257/98 |
| 2017/0194541 A1* | 7/2017 | Huang | ..................... H01L 33/62 |
| 2017/0338210 A1* | 11/2017 | Kim | ....................... H01L 25/167 |
| 2017/0365739 A1* | 12/2017 | Park | ......................... H01L 33/22 |

\* cited by examiner

*Primary Examiner* — Victor A Mandala
(74) *Attorney, Agent, or Firm* — Hanley, Flight & Zimmerman, LLC

(57) ABSTRACT

A light emitting component includes an epitaxial structure, a first electrode and a second electrode. The epitaxial structure includes a first type semiconductor layer, a second type semiconductor layer and a light emitting layer. The light emitting layer is located between the first type semiconductor layer and the second type semiconductor layer. The first electrode is connected to the first type semiconductor layer and at least part of the first electrode is located at a first side of the epitaxial structure. The second electrode is connected to the second type semiconductor layer and located at the first side of the epitaxial structure. A part of the second electrode is located between the second type semiconductor layer and a part of the first electrode.

21 Claims, 6 Drawing Sheets

LIGHT EMITTING COMPONENT AND DISPLAY DEVICE

CROSS-REFERENCE TO RELATED APPLICATIONS

This non-provisional application claims priority under 35 U.S.C. § 119(a) on Patent Application No(s). 106108082 filed in Taiwan, R.O.C. on Mar. 10, 2017, the entire contents of which are hereby incorporated by reference.

TECHNICAL FIELD

The disclosure relates to a light emitting component and a display device, more particularly to a light emitting component and a display device for improving unevenly-dispersed stress by an electrode structure.

BACKGROUND

Light emitting diodes (LEDs) have the advantages of high energy conversion efficiency, a relatively-small size and a relatively-long lifespan, so they nowadays have been widely applied to various electronic products, and are usually used as indicators or lighting, or used in display devices for displaying images. In brief, a LED includes an active light emitting layer and at least two different doped-type semiconductor layers, and by adjusting the materials of the active light emitting layer and semiconductor layers, manufacturers have been able to produce LEDs emitting light of different colors.

In a generic manufacturing process, an epitaxial structure including semiconductor layers and an active light emitting layer is formed before the epitaxial structure is etched and disposed with a plurality of electrical conductive members; thus, the semiconductor layers can contact the external circuit via the electrical conductive members. Then, the LED can be controlled by the external circuit for emitting light.

However, the disposition of electrical conductive members has resulted in a gap existing in a conventional LED structure, so a part of the LED structure is suspended. Moreover, to secure the LED to a related circuit, a certain degree of pressure will be applied to the LED. Due to the existence of the gap, the stress received by the entire LED structure is unevenly distributed. In this manufacturing process, the LED is very easily fractured, leading to the decrease of the process yield.

SUMMARY

The disclosure provides a light emitting component including an epitaxial structure, a first electrode and a second electrode. The epitaxial structure includes a first type semiconductor layer, a second type semiconductor layer and a light emitting layer. The light emitting layer is located between the first type semiconductor layer and the second type semiconductor layer. The first electrode is connected to the first type semiconductor layer, and located at least in part at a first side of the epitaxial structure. The second electrode is connected to the second type semiconductor layer and located at the first side of the epitaxial structure, and a part of the second electrode is located between the second type semiconductor layer and a part of the first electrode.

The disclosure discloses a display device including a display back plane and a plurality of light emitting components. The display back plane includes a plurality of first electrode contacting portions and a plurality of second electrode contacting portions. Each light emitting component includes an epitaxial structure, a first electrode and a second electrode. The epitaxial structure includes a first type semiconductor layer, a second type semiconductor layer and a light emitting layer. The light emitting layer is located between the first type semiconductor layer and the second type semiconductor layer. The first electrode is connected to one of the plurality of first electrode contacting portions and the first type semiconductor layer, and the first electrode is located at least in part at a first side of the epitaxial structure. The second electrode is connected to one of the plurality of second electrode contacting portions and the second type semiconductor layer, and the second electrode is located at the first side of the epitaxial structure and located in part between the second type semiconductor layer and a part of the first electrode.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
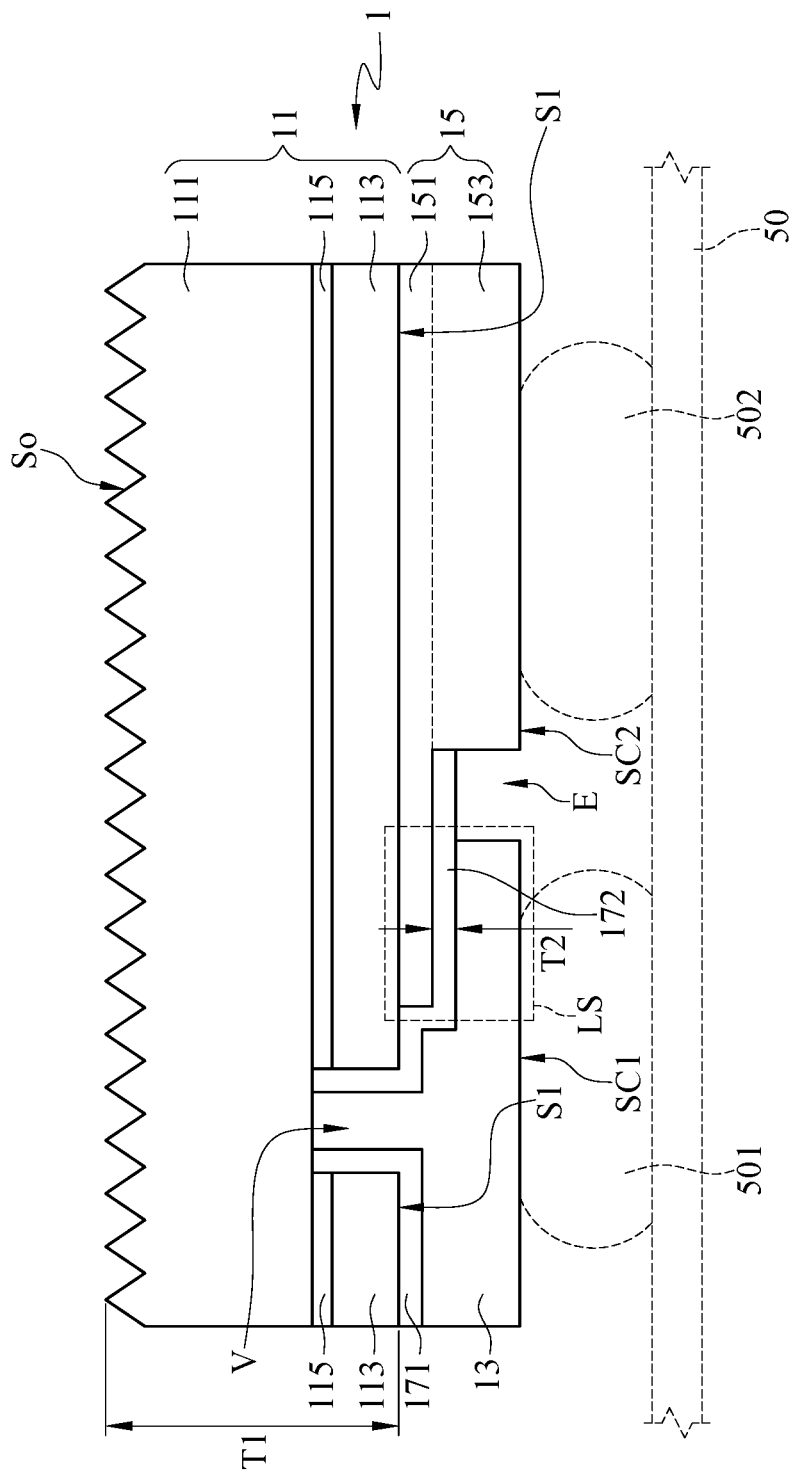
FIG. 1 is a cross-sectional view of a light emitting component according to one embodiment of the disclosure.

Please refer to FIG. 1. FIG. 1 is a cross-sectional view of a light emitting component according to one embodiment of the disclosure. As shown in FIG. 1, a light emitting component 1 includes an epitaxial structure 11, a first electrode 13 and a second electrode 15. The epitaxial structure 11 includes a first type semiconductor layer 111, a second type semiconductor layer 113 and a light emitting layer 115. The light emitting layer 115 is located between the first type semiconductor layer 111 and the second type semiconductor layer 113. The first electrode 13 is connected to the first type semiconductor layer 111, and at least a part of the first electrode 13 is located at a first side S1 of the epitaxial structure 11. The second electrode 15 is connected to the second type semiconductor layer 113. The second electrode 15 is located at the first side S1 of the epitaxial structure 11, and a part of the second electrode 15 is located between the second type semiconductor layer 113 and a part of the first electrode 13.

The epitaxial structure 11 includes one or more II-VI group materials (e.g. ZnSe) or nitrogen compound materials of III-V group (e.g. GaN, AlN, InN, InGaN, AlGaN or AlInGaN). Preferably, the thickness T1 of the epitaxial structure 11 is not larger than 6 micrometers (μm) and the thickness T1 of the epitaxial structure 11 is usually not less than 1 μm, because an epitaxial structure that is too thick or too thin will affect the yield of the follow-up process.

In this embodiment, the thickness of the first type semiconductor layer 111 is larger than the thickness of the second type semiconductor layer 113. For example, the thickness of the first type semiconductor layer 111 ranges from 1 μm to 5 μm, the thickness of the light emitting layer 115 ranges from 0.1 μm to 1 μm, and the thickness of the second type semiconductor layer 113 ranges from 0.1 μm to 0.5 μm; but the disclosure is not limited to this example. The second type semiconductor layer 113 and the first type semiconductor layer 111 have different doped-types respectively. For example, the first type semiconductor layer 111 is an N-doped semiconductor layer and the second type semiconductor layer 113 is a P-doped semiconductor layer. The light emitting layer 115 is, for example, a multiple quantum well (MQW) structure, but the disclosure is not limited to this example. Note that the maximum width of the light emitting component 1 ranges from 1 μm to 100 μm, and preferably, ranges from 3 μm to 30 μm; that is, the light emitting component 1 in this embodiment is a micro-scale light emitting component (e.g. Micro LED).

In the embodiment, as shown in FIG. 1, a part of the second electrode 15, a part of the second type semiconductor layer 113 and a part of the first electrode 13 form together a layered structure LS. In the layered structure LS, an insulation material 172 is disposed between a part of the second electrode 15 and a part of the first electrode 13 for preventing the first electrode 13 and the second electrode 15 from the occurrence of a short circuit between the first electrode 13 and the second electrode 15. Moreover, the insulation material 172 outside the layered structure LS further extends to and covers a part of the light emitting layer 115, a part of the second type semiconductor layer 113 and a part of the second electrode 15 for preventing the first electrode 13 from contacting the light emitting layer 115, the second type semiconductor layer 113 and the second electrode 15. The thickness T2 of the insulation material 172 disposed in the layered structure LS is not less than 0.3 μm for better insulation, and the thickness T2 of the insulation material 172 disposed in the layered structure LS is not larger than 1 μm for reducing the area occupied by the insulation material 172, in order to prevent the light-extraction efficiency from being affected. For example, the thickness of the insulation material 172 disposed in the layered structure LS is 0.3 μm, 0.5 μm, 0.7 μm, 0.9 μm or any value in the range. Moreover, a ratio between the thickness T2 of the insulation material 172 disposed in the layered structure LS and the thickness T1 of the epitaxial structure 11 ranges from 0.05 to 1; and if the ratio is less than 0.05, the bonding stress cannot be evenly dispersed, and if the ratio is larger than 1, the volume of the light emitting component 1 will increase. For example, a ratio between the thickness T2 of the insulation material 172 and the thickness T1 of the epitaxial structure 11 is 0.05, 0.075, 0.1 or any value in the range. For example, the insulation material 172 is made of one or more dielectric thin films or one or more insulation polymer materials. For example, the insulation material 172 is made of $Al_2O_3$, $SiO_2$, $Si_3N_4$ or a combination thereof. Note that the Young's modulus of the insulation material 172 is less than the Young's modulus of the epitaxial structure 11, of the first electrode 13 and of the second electrode 15 so that the insulation material 172 with greater deformability can be used as buffer in the bonding process.

Here, the first electrode 13 is, for example, an N type electrode, and the second electrode 15 is, for example, a P type electrode. In an embodiment, the first electrode 13 and the second electrode 15 are made of a high work function metal (e.g. platinum (Pt), nickel (Ni), titanium (Ti), gold (Au), chromium (Cr), silver (Ag) or an alloy or combination thereof), metal-oxide (e.g. indium tin oxide (ITO) or Zinc oxide (ZnO)) or electrical-conductive nonmetal material (e.g. electrical-conductive polymer, graphite, graphene or black phosphorus). In the case of metal material, the high work function metal is, for example, a metal with a work function not being less than 4.5 electron volts (eV). Therefore, the first electrode 13 and the epitaxial structure 11 may have better ohmic contact therebetween, and the second electrode 15 and the epitaxial structure 11 may have better ohmic contact therebetween.

The light emitting component 1 is used to selectively emit light according to the driving and control of a display backplane 50. For example, the display backplane 50 is a complementary metal-oxide-semiconductor (CMOS) substrate, liquid crystal on silicon (LCOS) substrate, thin film transistor (TFT) substrate or other substrate with a functional circuit. The structure of the display backplane 50 can be freely designed in view of the disclosure by technical personnel of ordinary skill in the art, and thus, its related details will not be described hereafter. The first electrode 13 is bonded to a first electrode contacting portion 501 of the display backplane 50, and the second electrode 15 is bonded to a second electrode contacting portion 502 of the display backplane 50. Therefore, the light emitting component 1 is electrically connected to and controlled by the display backplane 50.

In a control embodiment against the structure shown in FIG. 1, no element for supporting an epitaxial structure is formed between a first electrode and a second electrode, so a part of the epitaxial structure has to be supported by the first electrode and the second electrode and the central part of the epitaxial structure is suspended. In this case, when a force is applied to such a light emitting component for bonding the light emitting component to a display backplane, the stress received by a part of the epitaxial structure is different from the stress received by another part of the epitaxial structure (that is, the central part of the epitaxial structure is not supported) so that the epitaxial structure is easily fractured.

As compared to the above control embodiments, the first electrode 13, the second electrode 15 and the layered structure LS in the embodiment, as shown in FIG. 1, contact the first side S1 of the epitaxial structure 11 so that the epitaxial structure 11 can be supported by the first electrode 13, the second electrode 15 and the layered structure LS and nowhere in the epitaxial structure 11 is suspended. As shown in FIG. 1, a partial gap E exists between the first electrode 13 and the second electrode 15, but the size of this gap is relatively small. Moreover, this gap is located at the edge of the light emitting component 1 and is not related to the epitaxial structure so that this gap will not become a barrier to the function of such a supporting structure as increasing the allowance of the manufacture process of bonding the light emitting component 1 onto the display backplane 50. The ratio between the minimum width of the gap E and the maximum width of the light emitting component 1 ranges from 0.01 to 0.5. In practice, the ratio between the width of the gap E, i.e. the minimum distance between the first electrode 13 and the second electrode 15, and the maximum width of the light emitting component ranges from 0.01 to 0.5. Since this embodiment is related to a micro light emitting component in which the epitaxial structure 11 has weaker structural strength than the epitaxial structure of a conventional light emitting component, there is a certain degree of difficulty to control the generating of bonding stress. Therefore, when the above ratio is larger than 0.5, the epitaxial structure 11 may be fractured in the bonding process because the bonding stress cannot be evenly dispersed; and when the above ratio is less than 0.01, an insufficient gap may cause that the first electrode contacting portion 501 and the second electrode contacting portion 502 respectively spill over the first electrode 13 and the second electrode 15 to result in a short circuit between the first electrode 13 and the second electrode 15 as the first electrode 13 and the second electrode 15 are respectively bonded to the first electrode contacting portion 501 and the second electrode contacting portion 502. For example, the width of the foregoing gap E ranges from 1 µm to 5 µm. In another embodiment, another fabrication process may be applied to insert an insulation material or other material to the foregoing gap E, in order to enhance the structural completeness of a light emitting component.

In addition, the insulation layer in the layered structure LS, a part of the first electrode 13, and a part of the second electrode 15 are substantially parallel to each other, and via this construction, the layered structure LS may evenly disperse the stress and securely support the epitaxial structure 11 as receiving a force. In other words, the layered structure LS has a substantially even material dispersion, and the equivalent stress-related coefficient of the whole layered structure LS is similar to the stress-related coefficient of the first electrode 13 or the stress-related coefficient of the second electrode 15, thus, the layered structure LS may evenly disperse the stress on the epitaxial structure 11.

More particularly, in the layered structure LS, a part of the first electrode 13, a part of the insulation material 172 and a part of the second electrode 15 substantially overlap each other. The ratio between the area of the overlap and the area of the first electrode 13 ranges from 0.1 to 0.5, the ratio between the area of the overlap and the area of the second electrode 15 ranges from 0.1 to 0.5. This design may evenly disperse the bonding stress. Moreover, the area of the connection between the first electrode 13 and the first type semiconductor layer 111 and the area of the connection between the second electrode 15 and the second type semiconductor layer 113 can be designed to be larger for better current conduction efficiency.

In this embodiment, a part of the first electrode 13 and a part of the second electrode 15 at the first side S1 are substantially coplanar. More particularly, the electrode contact surface SC1 of the first electrode 13 and the electrode contact surface SC2 of the second electrode 15 are substantially coplanar. Therefore, applying the coplanar design to the electrode contact surface SC1 of the first electrode 13 and the electrode contact surface SC2 of the second electrode 15 may make the stress on the light emitting component 1 more well-dispersed as the light emitting component 1 is disposed to the display backplane 50.

In the embodiment shown in FIG. 1, the epitaxial structure 11 includes a through hole V, via which the first electrode 13 is connected to the first type semiconductor layer 111. This through hole V is formed by an etching process, for example. In this embodiment, the through hole V does not pass through the first type semiconductor layer 111, and a part of the first type semiconductor layer 111 is exposed by the through hole V. In detail, insulation materials 171 and 172 are formed on the inner wall of the through hole V, in order to prevent the first electrode 13 from contacting the light emitting layer 115 or the second type semiconductor layer 113 through the wall of the through hole V. On the other hand, in this embodiment, the area of the connection between the second electrode 15 and the second type semiconductor layer 113 is larger than the area of the connection between the first electrode 13 and the first type semiconductor layer 111.

Moreover, the light emitting component 1 has a light emitting surface So. When light is generated in the light emitting component 1, this light is mainly emitted to the outside of the light emitting component 1 from the light emitting surface So. The first side S1 is opposite to the light emitting surface So. The light emitting surface So of the light emitting component 1 is a flat surface or a rough surface. In this case, the light emitting surface So of the light emitting component 1 is assumed to be rough, in order to prevent light from the occurrence of total reflection at the light emitting surface So, namely, avoiding the decrease of light extraction efficiency. Preferably, the average roughness value of the light emitting surface So ranges from 50 nm to 1000 nm. In an embodiment, the second electrode 15 includes a reflection portion 151 and a contacting portion 153. The reflection portion 151 reflects light generated by the light emitting layer 115 so that the majority of the light is emitted outwardly from the light emitting surface So, and the light emitting component 1 provides light mainly via the light emitting surface So. In this embodiment, the material of the reflection portion 151 and the material of the contacting portion 153 are different. For example, the material of the reflection portion 151 is Ag, Al or an alloy thereof, and the material of the contacting portion 153 is a high work function metal, metal oxide or electrical-conductive nonmetal material, as described above. The thickness of the reflection portion 151 ranges, for example, from 0.5 µm to 0.8 µm. For instance, the thickness of the reflection portion 151 is 0.5 µm, 0.6 µm, 0.7 µm, 0.8 µm or any value in the range. In one or more undrawn embodiments, the material of the second electrode is, for example, a high work function metal, metal oxide or electrical-conductive nonmetal material, as described above, and the second electrode is formed in a single process or unibody process or is a one-piece electrode, but the disclosure is not limited to this example.

Figure 2:
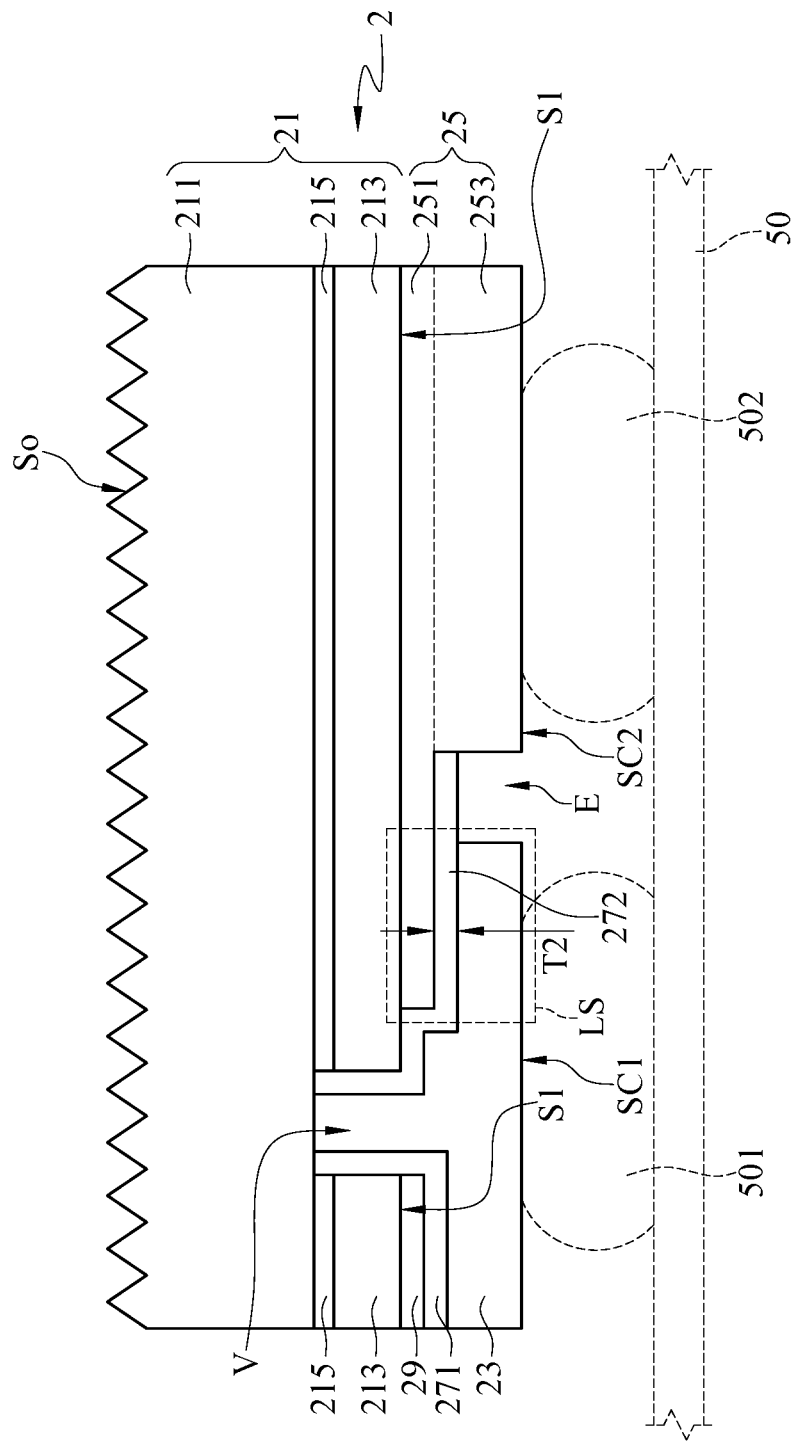
FIG. 2 is a cross-sectional view of a light emitting component according to another embodiment of the disclosure.

Please refer to FIG. 2. FIG. 2 is a cross-sectional view of a light emitting component according to another embodiment of the disclosure. In the embodiment shown in FIG. 2, the structure of a light emitting component 2 is similar to the structure of the light emitting component 1, and the same parts are not described hereafter. The light emitting component 2 in the embodiment shown in FIG. 2 further includes a reflection layer 29 located between an insulation material 271 and a second type semiconductor layer 213. For the light emitting component 2, the reflection layer 29 and a reflection portion 251 of a second electrode 25 are used to make the majority of light generated by the light emitting layer 115 emit to the outside from a light emitting surface So. The material of the reflection layer 29 is the same as the material of the reflection portion 251 of the second electrode 25 in an example, or the reflection layer 29 and the reflection portion 251 of the second electrode are formed in the same process step. For example, the material of the reflection layer 29 is Ag, Al, or an alloy thereof.

Figure 3:
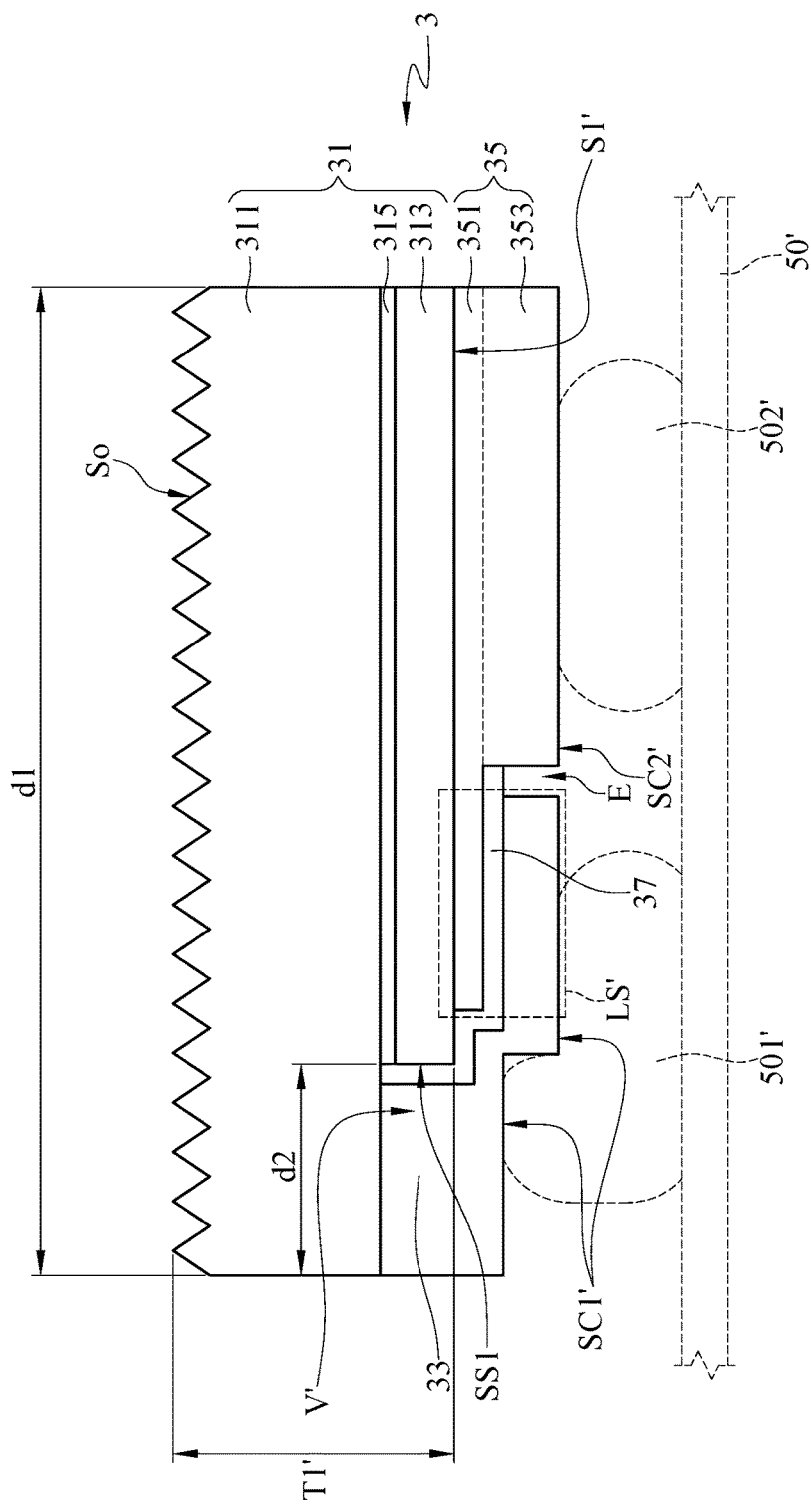
FIG. 3 is a cross-sectional view of a light emitting component according to yet another embodiment of the disclosure.

Please refer to FIG. 3. FIG. 3 is a cross-sectional view of a light emitting component according to yet another embodiment of the disclosure. In the embodiment shown in FIG. 3, the stricture of a light emitting component 3 is similar to the structure described in the previous embodiments. Different to the previous embodiments, the through hole V' in the embodiment shown in FIG. 3 is located at the edge of an epitaxial structure 31 and is exposed to the outside. In this embodiment, the through hole V' does not pass through a first type semiconductor layer 311, and a part of the first type semiconductor layer 311 is exposed to the through hole V'. A first electrode 33 covers a first side wall SS1 of the partial edge of the epitaxial structure 31, and is connected to the first type semiconductor layer 311 via the through hole V'. Since the inner wall of the through hole V' is not absolutely closed, a part of the first electrode 33 is exposed to the outside. In an embodiment, the edge of the first electrode 33 is substantially aligned with the side wall of the first type semiconductor layer 311. In another embodiment, the area of the connection between the first electrode 33 and the first type semiconductor layer 311 is smaller than the area of the exposed part of the first type semiconductor layer 311 at the through hole V'. Moreover, the ratio between the width d2 and the width d1 of the light emitting surface ranges from 0.05 to 0.3 so that the light emitting component 3 may have a proper light emitting area.

Figure 4:
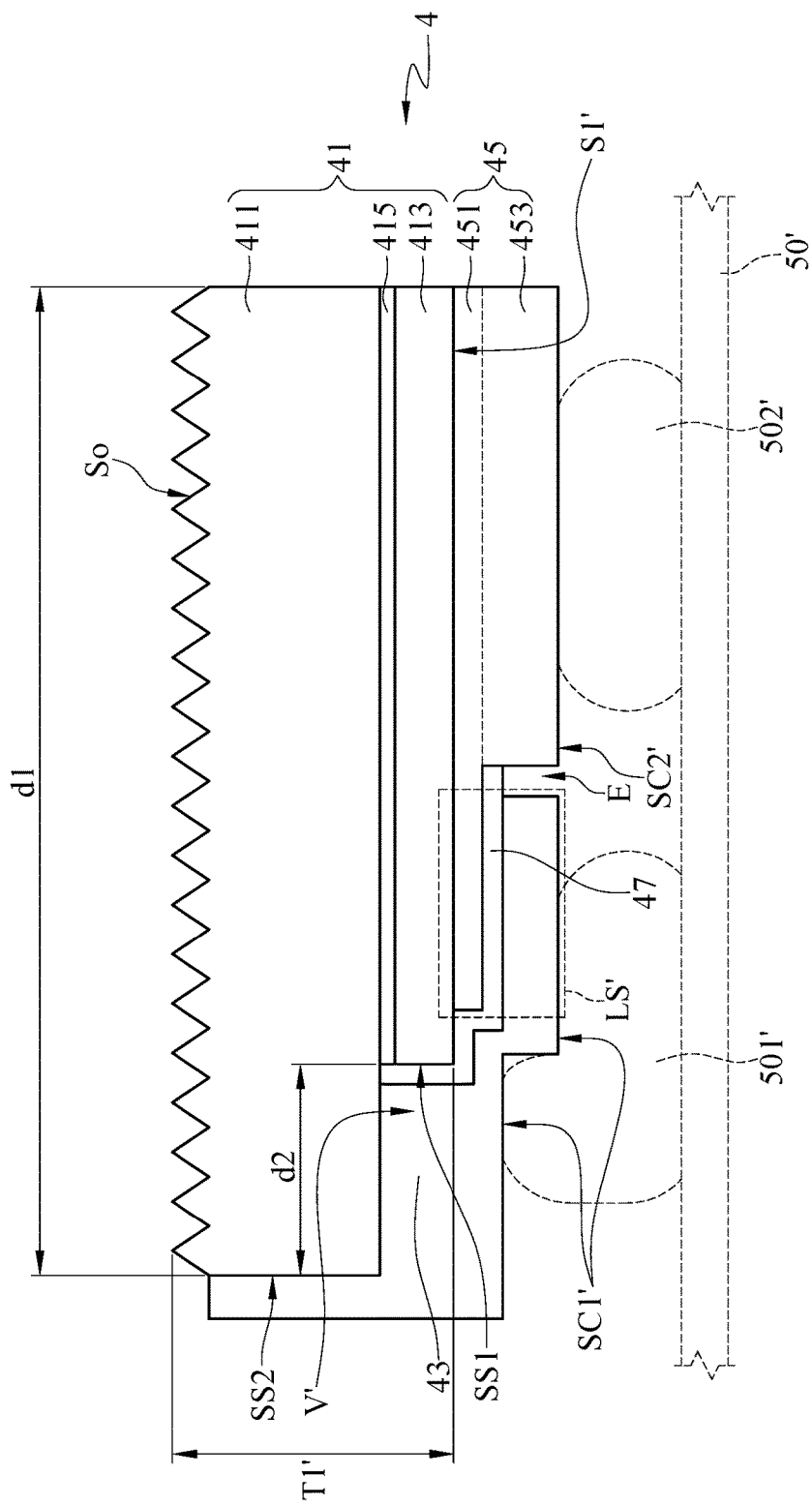
FIG. 4 is a cross-sectional view of a light emitting component according to yet another embodiment of the disclosure.

Please refer to FIG. 4. FIG. 4 is a cross-sectional view of a light emitting component according to yet another embodiment of the disclosure. In the embodiment shown in FIG. 4, the structure of a light emitting component 4 is similar to the light emitting component 3 in FIG. 3. Different from the light emitting component 3 in FIG. 3, a first electrode 43 in the embodiment in FIG. 4 further covers a second side wall SS2 of the partial edge of a first type semiconductor layer 411 and is connected to the first type semiconductor layer 411 at the second side wall SS2. Specifically, in addition to being connected to the first type semiconductor layer 411 via the through hole V', the first electrode 43 further extends from the through hole V' to the second side wall SS2. In a particular example, the light emitting component 4 and other light emitting components are arranged in an array disposed in a display backplane 50'. Not considering edges, the extension of the first electrode 43 from the through hole V' is located between the light emitting component 4 and other light emitting components. In this way, the area of the connection between the first electrode 43 and the first type semiconductor layer 411 increases. Furthermore, the light emitting area of the light emitting component 4 increases as the width d2 decreases.

In an embodiment, one of the edges of the first electrode 43 is substantially coplanar with the light emitting surface So. In the case of the embodiment based on the rough light emitting surface So, said "coplanar" is defined based on, for example, the highest point, the lowest point or the mean thickness of the light emitting surface So. In another embodiment, the first electrode 43 extends from the through hole V' and covers the entire second side wall SS2. In another aspect, the area of the covered region of the second side wall SS2 by the first electrode 43 is substantially equal to the area of the second side wall SS2. In yet another embodiment, the first electrode 43 extends from the through hole and covers a part of the second side wall SS2. In another aspect, the area of the covered region of the second side wall SS2 by the first electrode 43 is smaller than the area of the second side wall SS2.

Figure 5:
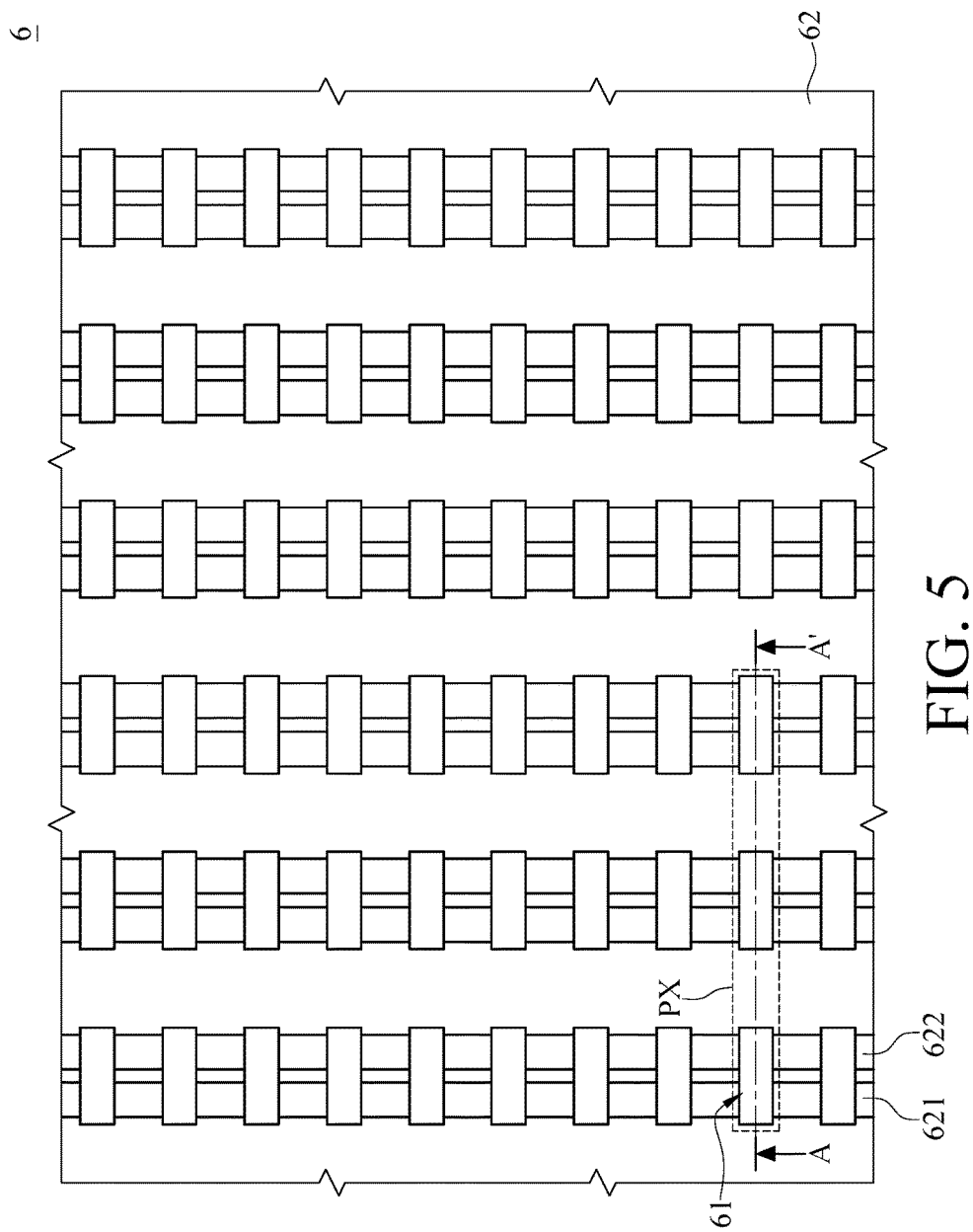
FIG. 5 is a top view of a display device according to one embodiment of the disclosure.
Figure 6:
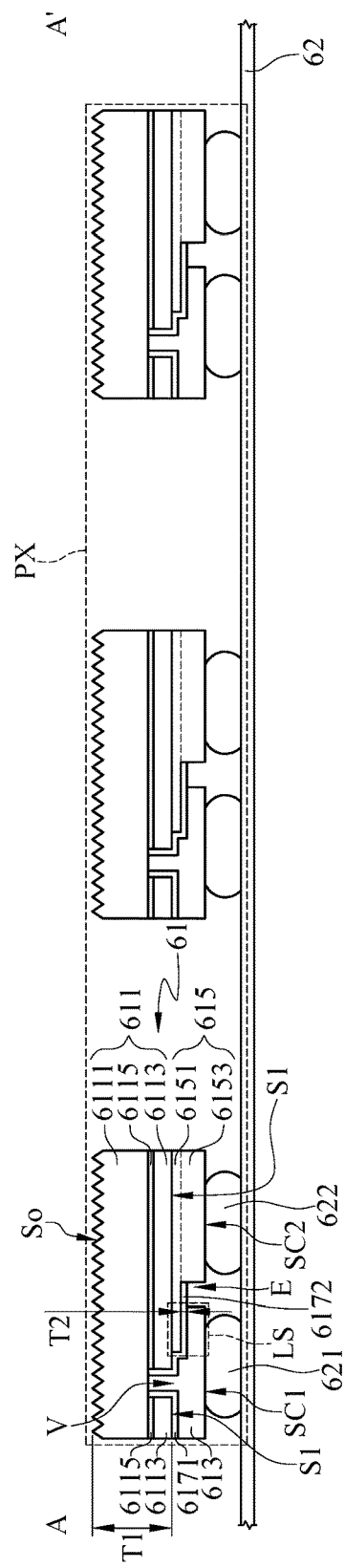
FIG. 6 is a cross-sectional view of FIG. 5 in a cross-sectional line AA'.

Please refer to FIG. 5 and FIG. 6. FIG. 5 is a top view of a display device according to one embodiment of the disclosure, and FIG. 6 is a cross-sectional view of FIG. 5 in a cross-sectional line AA'. As shown in FIG. 5 and FIG. 6, a display device 6 includes a display backplane 62 and a plurality of light emitting components 61. For example, the display backplane 62 is a CMOS substrate, LCOS substrate, TFT substrate or another substrate with a functional circuit. The structure of the display backplane 60 can be freely designed in view of the disclosure by all those who have ordinary skill in the art, thus, the related details are not described hereafter. In this embodiment, the display backplane 62 is, for example, a TFT substrate. Each display back plane has a similar structure, so one of the structures of one of the display back planes is exemplified for illustration purposes. The display backplane 62 includes a plurality of first electrode contacting portions and a plurality of second electrode contacting portions, e.g. a first electrode contacting portion 621 and a second electrode contacting portion 622. The light emitting component 61 includes an epitaxial structure 611, a first electrode 613 and a second electrode 615. The epitaxial structure 611 includes a first type semiconductor layer 6111, a second type semiconductor layer 6113 and a light emitting layer 6115. The light emitting layer 6115 is located between the first type semiconductor layer 6111 and the second type semiconductor layer 6113. The first electrode 613 is connected to the first electrode contacting portion 621 and the first type semiconductor layer 6111. At least part of the first electrode 613 is located at the first side S1 of the epitaxial structure 611. The second electrode 615 is connected to the second electrode contacting portion 622 and the second type semiconductor layer 6113. The second electrode 615 is located at the first side S1 of the epitaxial structure 611. A part of the second electrode 615 is located between the second type semiconductor layer 6113 and a part of the first electrode 613.

The light emitting components 61 in the display device 6 are arranged in an array, for example. Also, each light emitting component 61 in the display device 6 has the structure of at least one of the embodiments shown in FIG. 1 to FIG. 4, and is not limited to the structure shown in FIG. 6. The detailed structures of the light emitting components 61 have been described as above, and all those who have ordinary skill in the art should understand the detailed structure of each light emitting component 61 in the display device 6 in view of the aforementioned embodiments. These light emitting components 61 can be used to construct a plurality of pixel structures PX, and each pixel structure PX includes at least one the light emitting component 61. In the embodiment, a pixel structure PX constructed by three light emitting components 61 is exemplified. In the case of the pixel structure PX shown in FIG. 5, the three light emitting components 61 in the pixel structure PX respectively correspond to a blue sub pixel, a green sub pixel and a red sub pixel. Note that these pixel structures PX are able to provide a better resolution of about 40~500 pixels per inch (PPI).

To sum up, the disclosure provides a light emitting component and a display device. In the disclosure, at least part of a first electrode is formed at the first side of an epitaxial structure as a part of the second electrode is formed between a second type semiconductor layer and a part of the first electrode, in order to decrease the gap between the electrodes of the light emitting component and the related circuits of the display device to be bonded. Therefore, the stress received by all over the light emitting component may be more well-dispersed when the light emitting component is being bonded to the related circuit of the display device, and then, the light emitting component may be prevented from being fractured in the manufacturing process. Also, the process yield may increase.

What is claimed is:

1. A light emitting component, comprising:
an epitaxial structure, comprising:
a first type semiconductor layer;
a second type semiconductor layer; and
a light emitting layer located between the first type semiconductor layer and the second type semiconductor layer;
a first electrode connected to the first type semiconductor layer and located at least in part at a first side of the epitaxial structure; and
a second electrode connected to the second type semiconductor layer and located at the first side of the epitaxial structure, and a part of the second electrode located between the second type semiconductor layer and a part of the first electrode,
wherein the first electrode and the second electrode have a gap therebetween, and a ratio between a minimum width of the gap and a maximum width of the light emitting component ranges from 0.01 to 0.5.

2. The light emitting component according to claim 1, wherein the part of the second electrode, a part of the second type semiconductor layer and the part of the first electrode form a layered structure together, and in the layered structure, an insulation material is disposed between the part of the first electrode and the part of the second electrode.

3. The light emitting component according to claim 2, wherein a ratio between a thickness of the insulation material in the layered structure and a thickness of the epitaxial structure ranges from 0.05 to 1.

4. The light emitting component according to claim 3, wherein the thickness of the insulation material in the layered structure ranges from 0.3 μm to 1 μm.

5. The light emitting component according to claim 2, wherein a Young's modulus of the insulation material in the layered structure is less than a Young's modulus of the epitaxial structure, a Young's modulus of the first electrode and a Young's modulus of the second electrode.

6. The light emitting component according to claim 2, wherein the layered structure is located at a middle position on the first side of the epitaxial structure, and the first and second electrode are located at two opposite sides of the layered structure.

7. The light emitting component according to claim 1, wherein the light emitting component has a light emitting surface, and the first side is opposite to the light emitting surface.

8. The light emitting component according to claim 7, wherein the light emitting surface is rough and has an average roughness value ranging from 50 nm to 1000 nm.

9. The light emitting component according to claim 1, wherein a surface of the first electrode, which is away from the epitaxial structure, and a surface of the second electrode, which is away from the epitaxial structure, are substantially coplanar.

10. The light emitting component according to claim 1, wherein the epitaxial structure includes at least one through hole, and the first electrode is connected to the first type semiconductor layer via the at least one through hole.

11. The light emitting component according to claim 10, wherein an area of connection between the second electrode and the second type semiconductor layer is larger than an area of connection between the first electrode and the first type semiconductor layer.

12. The light emitting component according to claim 1, wherein the first electrode covers a first side wall of a partial edge of the epitaxial structure and a second side wall of a partial edge of the first type semiconductor layer, and the first electrode at the second side wall is connected to the first type semiconductor layer.

13. A display device, comprising:
a display backplane, comprising a plurality of first electrode contacting portions and a plurality of second electrode contacting portions; and
a plurality of light emitting components each comprising:
an epitaxial structure, comprising:
a first type semiconductor layer;
a second type semiconductor layer; and
a light emitting layer located between the first type semiconductor layer and the second type semiconductor layer;
a first electrode connected to one of the plurality of first electrode contacting portions and the first type semiconductor layer, and located at least in part at a first side of the epitaxial structure; and
a second electrode connected to one of the plurality of second electrode contacting portions and the second type semiconductor layer, and located at the first side of the epitaxial structure, and a part of the second electrode located between the second type semiconductor layer and a part of the first electrode,
wherein the first electrode and the second electrode have a gap therebetween, and a ratio between a minimum width of the gap and a maximum width of the light emitting component ranges from 0.01 to 0.5.

14. The display device according to claim 13, wherein a part of the second electrode, a part of the second type semiconductor layer and a part of the first electrode form together a layered structure in each one of the plurality of light emitting components, and in the layered structure, an insulation material is disposed between the part of the second electrode and the part of the first electrode.

15. The display device according to claim 14, wherein a ratio between a thickness of the insulation material in the layered structure in each one of the plurality of light emitting components and a thickness of the epitaxial structure ranges from 0.05 to 1.

16. The display device according to claim 15, wherein the thickness of the insulation material in the layered structure in each one of the plurality of light emitting components ranges from 0.3 μm to 1 μm.

17. The display device according to claim 14, wherein a Young's modulus of the insulation material in the layered structure in each one of the plurality of light emitting components is less than a Young's modulus of the epitaxial structure, a Young's modulus of the first electrode, a Young's modulus of the second electrode, a Young's modulus of the first electrode contacting portion and a Young's modulus of the second electrode contacting portion.

18. The display device according to claim 13, wherein a surface of the first electrode, which is away from the epitaxial structure, a surface of the second electrode, which is away from the epitaxial structure, the first electrode contacting portion and the second electrode contacting portion are substantially coplanar.

19. The display device according to claim 13, wherein one of the plurality of first electrode contacting portions is substantially the same as one of the plurality of second electrode contacting portions in size.

20. A light emitting component, comprising:
an epitaxial structure, comprising:
- a first type semiconductor layer;
- a second type semiconductor layer; and
- a light emitting layer located between the first type semiconductor layer and the second type semiconductor layer;

a first electrode located on the epitaxial structure, and a part of the first electrode contacting directly the first type semiconductor layer; and a second electrode located on the epitaxial structure and contacting the second type semiconductor layer, and a part of the second electrode located between the second type semiconductor layer and the first electrode.

21. The light emitting component according to claim 20, wherein the part of the second electrode, a part of the second type semiconductor layer and another part of the first electrode form a layered structure, and in the layered structure, an insulation material is disposed between the another part of the first electrode and the part of the second electrode, and a ratio between a thickness of the insulation material in the layered structure and a thickness of the epitaxial structure ranges from 0.05 to 1.

* * * * *